United States Patent
Kwon

(10) Patent No.: US 9,209,317 B1
(45) Date of Patent: Dec. 8, 2015

(54) NONVOLATILE MEMORY DEVICES AND METHODS OF OPERATING THE SAME

(71) Applicant: SK hynix Inc., Incheon-si Gyeonggi-do (KR)

(72) Inventor: Young Joon Kwon, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/851,172

(22) Filed: Sep. 11, 2015

Related U.S. Application Data

(62) Division of application No. 14/024,319, filed on Sep. 11, 2013.

(30) Foreign Application Priority Data

Mar. 28, 2013 (KR) .................. 10-2013-0033696

(51) Int. Cl.
*G11C 11/34* (2006.01)
*H01L 29/792* (2006.01)
*G11C 16/04* (2006.01)

(52) U.S. Cl.
CPC .......... *H01L 29/792* (2013.01); *G11C 16/0475* (2013.01)

(58) Field of Classification Search
CPC ... H01L 29/792; G11C 16/0475; G11C 16/30
USPC .............. 365/185.26, 185.1, 185.14
See application file for complete search history.

(56) References Cited

U.S. PATENT DOCUMENTS

| | | | | |
|---|---|---|---|---|
| 7,005,349 B2* | 2/2006 | Lee | ............ | H01L 21/28282 257/E21.21 |
| 7,045,848 B2* | 5/2006 | Shukuri | ............ | B82Y 10/00 257/311 |
| 7,408,806 B2* | 8/2008 | Park | ............ | G11C 8/08 257/E21.423 |
| 7,602,010 B2* | 10/2009 | Choi | ............ | H01L 27/115 257/317 |
| 7,645,663 B2* | 1/2010 | Shum | ............ | H01L 27/105 438/219 |
| 8,106,444 B2* | 1/2012 | Terai | ............ | H01L 21/28282 257/255 |
| 8,258,562 B2* | 9/2012 | Izumida | ............ | H01L 27/11521 257/314 |
| 8,947,122 B2* | 2/2015 | Prabhakar | ............ | H03K 19/0944 326/46 |
| 2006/0092705 A1* | 5/2006 | Seo | ............ | G11C 16/0458 365/185.18 |
| 2011/0049609 A1* | 3/2011 | Nagai | ............ | G11C 16/0466 257/324 |
| 2014/0293708 A1* | 10/2014 | Kwon | ............ | H01L 29/792 365/185.23 |

* cited by examiner

*Primary Examiner* — Viet Q Nguyen
(74) *Attorney, Agent, or Firm* — William Park & Associates Ltd.

(57) ABSTRACT

Nonvolatile memory devices including three transistor unit cells are provided. The nonvolatile memory device includes a selection transistor having a first terminal and a second terminal, a first charge trap transistor electrically connected in series to the first terminal of the selection transistor, a second charge trap transistor electrically connected in series to the second terminal of the selection transistor, and a word line electrically connected to gate electrodes of the selection transistor, the first charge trap transistor and the second charge trap transistor. Related methods are also provided.

10 Claims, 8 Drawing Sheets

FIG.4

|  | WL | SL | BL |
|---|---|---|---|
| Program 1 | +$V_{PP}$ | +$V_{SL1}$ | 0 V |
| Program 2 | +$V_{PP}$ | 0 V | +$V_{BL1}$ |
| Erasure | -$V_{ee1}$ | +$V_{ee2}$ | +$V_{ee2}$ |
| Read 1 | $V_{read}$ | 0 V | +$V_{BL2}$ |
| Read 2 | $V_{read}$ | +$V_{SL2}$ | 0 V |

FIG.6

| Unit Cell No. | | Program | Erasure | Read |
|---|---|---|---|---|
| 410 | WL0 | $+V_{PP}$ | $-V_{ee1}$ | $V_{read}$ |
| | SL0 | 0 | $+V_{ee2}$ | 0 V |
| | BL0 | $+V_{BL1}$ | $+V_{ee2}$ | $+V_{BL2}$ |
| 420 | WL0 | $+V_{PP}$ | $-V_{ee1}$ | $V_{read}$ |
| | SL1 | 0 V | 0 V | 0 V |
| | BL1 | 0 V | 0 V | 0 V |
| 430 | WL1 | 0 V | 0 V | 0 V |
| | SL0 | 0 V | $+V_{ee2}$ | 0 V |
| | BL0 | $+V_{BL1}$ | $+V_{ee2}$ | $+V_{BL2}$ |
| 440 | WL1 | 0 V | 0 V | 0 V |
| | SL1 | 0 V | 0 V | 0 V |
| | BL1 | 0 V | 0 V | 0 V |

# NONVOLATILE MEMORY DEVICES AND METHODS OF OPERATING THE SAME

CROSS-REFERENCE TO RELATED APPLICATION

The present application claims priority under 35 U.S.C 119(a) to Korean Application No. 10-2013-0033696, filed on Mar. 28, 2013, in the Korean intellectual property Office, which is incorporated herein by reference in its entirety as set forth in full.

BACKGROUND

1. Technical Field

Embodiments of the present disclosure generally relate to semiconductor devices and methods of operating the same and, more particularly, to nonvolatile memory devices and methods of operating the same.

2. Related Art

Semiconductor memory devices may be typically categorized as either volatile memory devices or nonvolatile memory devices. The volatile memory devices lose their stored data when their power supplies are interrupted even though their operation speed (e.g., a time it takes to read out data stored in memory cells or a time it takes to write external data into the memory cells) is relatively fast. In contrast, the nonvolatile memory devices retain their stored data even when their power supplies are interrupted. Thus, the nonvolatile memory devices are used in electronic systems that need to retain certain data regardless of interruption of the power supplies. The nonvolatile memory devices may include mask read only memory (MROM) devices, programmable read only memory (PROM) devices, erasable programmable read only memory (EPROM) devices, electrically erasable programmable read only memory (EEPROM) devices, flash memory devices and etc.

In general, the MROM devices, the PROM devices and the EPROM devices may need some additional utilities (e.g., a UV irradiator) to erase their stored data. Thus, it may be inconvenient to operate and use the MROM devices, the PROM devices and the EPROM devices. In contrast, the data stored in the EEPROM devices can be electrically erased even without any additional utilities and external data can also be electrically programmed into the EEPROM devices without any additional utilities. Accordingly, the EEPROM devices may be widely used in various areas, for example, system program executions or auxiliary memory devices necessitating frequent data renewals. In particular, data stored in the flash memory devices can be simultaneously erased by the certain unit (e.g., by the page) and the flash memory devices may have a higher integration density than the EEPROM devices. Hence, the flash memory devices have been used in the auxiliary memory devices having a large capacity.

The number of data, which is capable of storing in each memory cell of the nonvolatile memory devices, may be determined according to the number of bits that are stored in each memory cell. A memory cell in which a single bit data is stored is referred to as a single bit cell or a single level cell (SLC). In contrast, a memory cell in which multi-bit data (e.g., data including at least two bit or more) are stored is referred to as a multi-bit cell, a multi-level cell (MLC) or a multi-state cell. Recently, as the semiconductor memory devices become more highly integrated, the nonvolatile memory devices employing the MLCs have been increasingly required and developed.

SUMMARY

Various embodiments are directed to nonvolatile memory devices and methods of operating the same.

According to some embodiments, a nonvolatile memory device includes a selection transistor having a first terminal and a second terminal, a first charge trap transistor electrically connected in series to the first terminal of the selection transistor, a second charge trap transistor electrically connected in series to the second terminal of the selection transistor, and a word line electrically connected to gate electrodes of the selection transistor, the first charge trap transistor and the second charge trap transistor.

In some embodiments, the first charge trap transistor may include a first terminal connected to the first terminal of the selection transistor and a second terminal connected to a source line.

In some embodiments, the second terminal of the first charge trap transistor may be connected to a first impurity junction region.

In some embodiments, the second charge trap transistor may include a first terminal connected to a bit line and a second terminal connected to the second terminal of the selection transistor.

In some embodiments, the first terminal of the second charge trap transistor may be connected to a second impurity junction region.

According to further embodiments, a nonvolatile memory device includes a substrate having a first charge trap region, a second charge trap region, and a selection region between the first and second charge trap regions. A first impurity junction region is disposed in a portion of the substrate of the first charge trap region. A second impurity junction region is disposed in a portion of the substrate of the second charge trap region. A first insulation layer pattern is disposed on the substrate having the first charge trap region, the second charge trap region and the selection region. A gate conductive layer pattern is disposed on the first insulation layer pattern in the selection region. A second insulation layer pattern disposed to cover the gate conductive layer pattern located in the selection region and to extend onto the first insulation layer pattern located in the first and second charge trap regions. A charge trap layer pattern, a third insulation layer pattern and a control gate are sequentially stacked on the second insulation layer pattern.

In some embodiments, the gate conductive layer pattern may be separated from the control gate by the second insulation layer pattern, the charge trap layer pattern and the third insulation layer pattern to have a floated state.

In some embodiments, the second insulation layer pattern, the charge trap layer pattern and the third insulation layer pattern may be stacked to have an oxide-nitride-oxide (ONO) structure.

According to further embodiments, a method of operating a nonvolatile memory device includes programming a unit cell of the nonvolatile memory device. The unit cell includes a first charge trap transistor, a selection transistor and a second charge transistor which are electrically connected in series between a source line and a bit line. The selection transistor is disposed between the first charge trap transistor connected to the source line and the second charge trap transistor connected to the bit line. In such a case, programming the unit cell includes selectively programming the first charge trap transistor by applying a program voltage to a word line connected to gate electrodes of the first and second charge trap transistors and a gate electrode of the selection transistor, applying a ground voltage to the bit line, and applying a first source line voltage to the source line. In addition, programming the unit cell includes selectively programming the second charge trap transistor by applying the program voltage to the word line, applying a ground voltage to the source line, and applying a first bit line voltage to the bit line.

In some embodiments, the method may further include erasing at least one of the first and second charge trap transistors by applying a negative erasure voltage to the word line and applying a positive erasure voltage to at least one of the source line and the bit line.

In some embodiments, the method may further include selectively reading out a datum stored in the first charge trap transistor and selectively reading out a datum stored in the second charge trap transistor. The datum stored in the first charge trap transistor may be selectively read out by applying a read voltage to the word line, applying a ground voltage to the source line, and applying a second bit line voltage to the bit line. The datum stored in the second charge trap transistor may be selectively read out by applying the read voltage to the word line, applying a second source line voltage to the source line, and applying a ground voltage to the bit line.

According to further embodiments, a cell array includes a first unit cell including a selection transistor having a first terminal and a second terminal; a first charge trap transistor including a first terminal electrically connected in series to the first terminal of the selection transistor and a second terminal electrically connected to a first source line; a second charge trap transistor including a first terminal electrically connected to a first bit line and a second terminal electrically connected in series to the second terminal of the selection transistor; and a first word line electrically connected to gate electrodes of the selection transistor, the first charge trap transistor and the second charge trap transistor; and a second unit cell including: a selection transistor having a first terminal and a second terminal; a first charge trap transistor including a first terminal electrically connected in series to the first terminal of the selection transistor and a second terminal electrically connected to a second source line; a second charge trap transistor including a first terminal electrically connected to a second bit line and a second terminal electrically connected in series to the second terminal of the selection transistor; and a first word line electrically connected to gate electrodes of the selection transistor, the first charge trap transistor and the second charge trap transistor; and a third unit cell including: a selection transistor having a first terminal and a second terminal; a first charge trap transistor including a first terminal electrically connected in series to the first terminal of the selection transistor and a second terminal electrically connected to a first source line; a second charge trap transistor including a first terminal electrically connected to a first bit line and a second terminal electrically connected in series to the second terminal of the selection transistor; and a second word line electrically connected to gate electrodes of the selection transistor, the first charge trap transistor and the second charge trap transistor; and a fourth unit cell including: a selection transistor having a first terminal and a second terminal; a first charge trap transistor including a first terminal electrically connected in series to the first terminal of the selection transistor and a second terminal electrically connected to a second source line; a second charge trap transistor including a first terminal electrically connected to a second bit line and a second terminal electrically connected in series to the second terminal of the selection transistor; and a second word line electrically connected to gate electrodes of the selection transistor, the first charge trap transistor and the second charge trap transistor.

BRIEF DESCRIPTION OF THE DRAWINGS

Embodiments of the inventive concept will become more apparent in view of the attached drawings and accompanying detailed description, in which:

FIG. 4 is a table illustrating an operation of the unit cell shown in FIG. 3;

FIG. 6 is a table illustrating an operation of the cell array shown in FIG. 5.

DETAILED DESCRIPTION OF THE EMBODIMENTS

Figure 1:
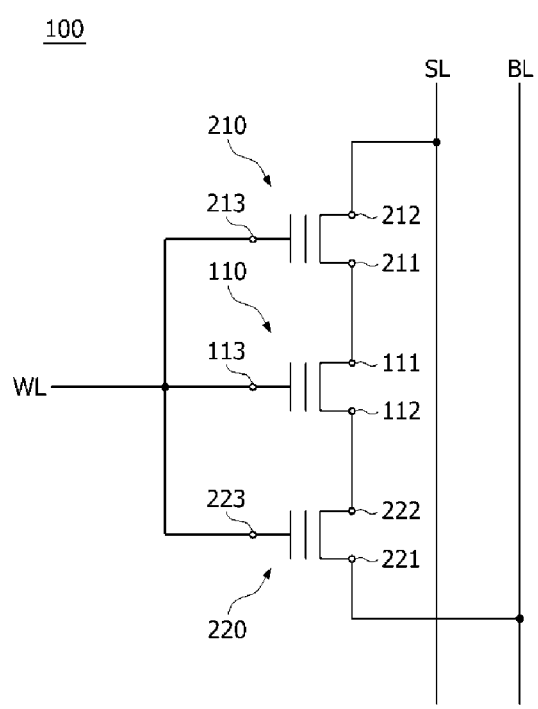
FIG. 1 is an equivalent circuit diagram illustrating a unit cell of a nonvolatile memory device according to some embodiments.

Referring to FIG. 1, a unit cell 100 of a nonvolatile memory device according to some embodiments may be configured to include a selection transistor 110, a first charge trap transistor 210 and a second charge trap transistor 220. The selection transistor 110 may include a first terminal 111, a second terminal 112 and a gate electrode 113. The first charge trap transistor 210, the selection transistor 110 and the second charge trap transistor 220 may be connected in series. For example, the first terminal 111 of the selection transistor 110 may be electrically connected in series to the first charge trap transistor 210, and the second terminal 112 of the selection transistor 110 may be electrically connected in series to the second charge trap transistor 220. The first charge trap transistor 210 may also include a first terminal 211, a second terminal 212 and a gate electrode 213. The first terminal 211 of the first charge trap transistor 210 may be electrically connected to the first terminal 111 of the selection transistor 110, and the second terminal 212 of the first charge trap transistor 210 may be electrically connected to an impurity junction region. Similarly, the second charge trap transistor 220 may also include a first terminal 221, a second terminal 222 and a gate electrode 223. The second terminal 222 of the second charge trap transistor 220 may be electrically connected to the second terminal 112 of the selection transistor 110, and the first terminal 221 of the first charge trap transistor 220 may be electrically connected to another impurity junction region. The second terminal 212 of the first charge trap transistor 210 may be electrically connected to a source line SL, and the first terminal 221 of the second charge trap transistor 220 may be electrically connected to a bit line BL. The gate electrodes 113 of the selection transistor 110, the gate electrode 213 of the first charge trap transistor 210 and the gate electrode 223 of the second charge trap transistor 220 may be electrically connected to a word line WL.

As described above, the unit cell 100 of the nonvolatile memory device according to some embodiments may be configured to include the selection transistor 110. Thus, when the unit cell 100 is selected to operate under a read mode, no current flows through non-selected unit cells sharing the bit line BL connected to the selected unit cell 100. This is because all the selection transistors of the non-selected unit cells are turned off under the read mode to prevent an undesired leakage current from flowing through the non-selected unit cells and the bit line BL connected thereto even though at least one of the non-selected unit cells has an over-erased state. As a result, the data stored in the selected unit cell 100 can be correctly read out without any errors even though the non-selected unit cells are over-erased prior to the read mode. In addition, the unit cell 100 is configured to include two charge trap transistors, that is, the first and second charge trap transistors 210 and 220 which are connected in series to the selection transistor 110. Thus, two bits of data can be stored in the unit cell 100.

Figure 2:
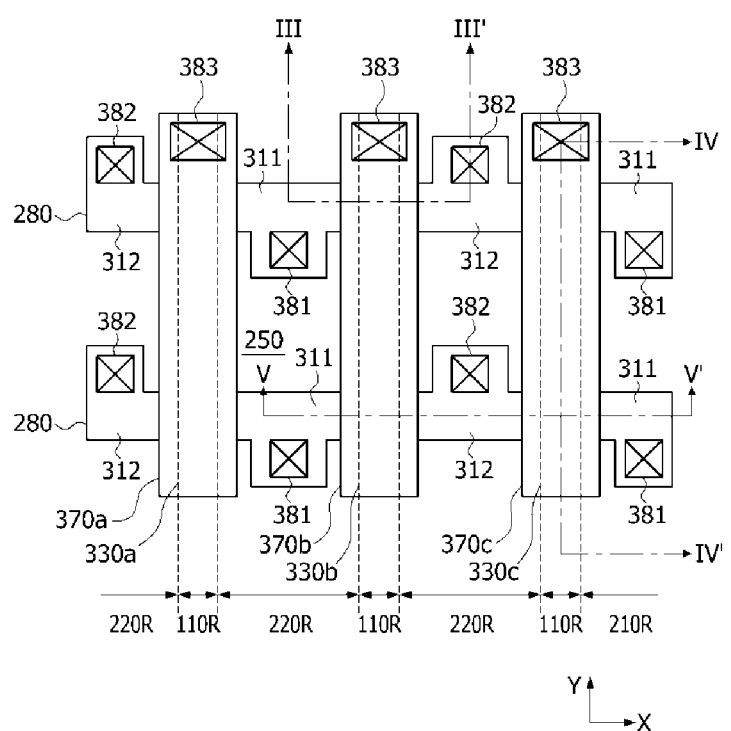
FIG. 2 is a layout diagram illustrating a cell array region of a nonvolatile memory device according to some embodiments.

Referring to FIG. 2, a plurality of active regions 280 defined by an isolation region 250 may be disposed to have stripe shapes which are parallel with an X-axis direction. The active regions 280 may be arrayed in a Y-axis direction intersecting the X-axis direction to be spaced apart from each other by a certain distance. Control gates 370a, 370b and 370c may be disposed to have stripe shapes which are parallel with the Y-axis direction. That is, the control gates 370a, 370b and 370c may be disposed to intersect the active regions 280. The control gates 370a, 370b and 370c may be arrayed in the X-axis direction to be spaced apart from each other by a certain distance. A word line contact 383 may be disposed on an end of each of the control gates 370a, 370b and 370c to electrically connect one of the control gates 370a, 370b and 370c to one of word line electrodes. Gates 330a, 330b and 330c of selection transistors may be disposed below respective ones of the control gates 370a, 370b and 370c, as plotted by dotted lines. Although not shown in the drawings, a charge trap layer may be disposed between the control gates 370a, 370b and 370c and the gates 330a, 330b and 330c. A detailed description to the charge trap layer will be developed with reference to FIG. 3 later.

A first impurity junction region 311 or a second impurity junction region 312 may be disposed in each of the active regions 280 between the control gates 370a, 370b and 370c. In some embodiments, the first impurity junction region 311 may correspond to a source region, and the second impurity junction region 312 may correspond to a drain region. The first and second impurity junction regions 311 and 312 may be alternately disposed in each of the active regions 280. That is, the first and second impurity junction regions 311 and 312 may be disposed in the active region 280 at two opposite sides of each control gate 370a, 370b or 370c. First contacts 381 may be disposed on respective ones of the first impurity junction regions 311, and the first impurity junction regions 311 may be electrically connected to first electrodes, for example, source electrodes through the first contacts 381. Although not shown in the drawings, all the first contacts 381 disposed on each of the active regions 280 may be connected to one of the source electrodes. That is, all the first impurity junction regions 311 disposed in each of the active regions 280 may be electrically connected to one of the source electrodes. Similarly, second contacts 382 may be disposed on respective ones of the second impurity junction regions 312, and the second impurity junction regions 312 may be electrically connected to second electrodes, for example, drain electrodes through the second contacts 382. Although not shown in the drawings, all the second contacts 382 disposed on each of the active regions 280 may be connected to one of the drain electrodes. That is, all the second impurity junction regions 312 disposed in each of the active regions 280 may be electrically connected to one of the drain electrodes.

Figure 3:
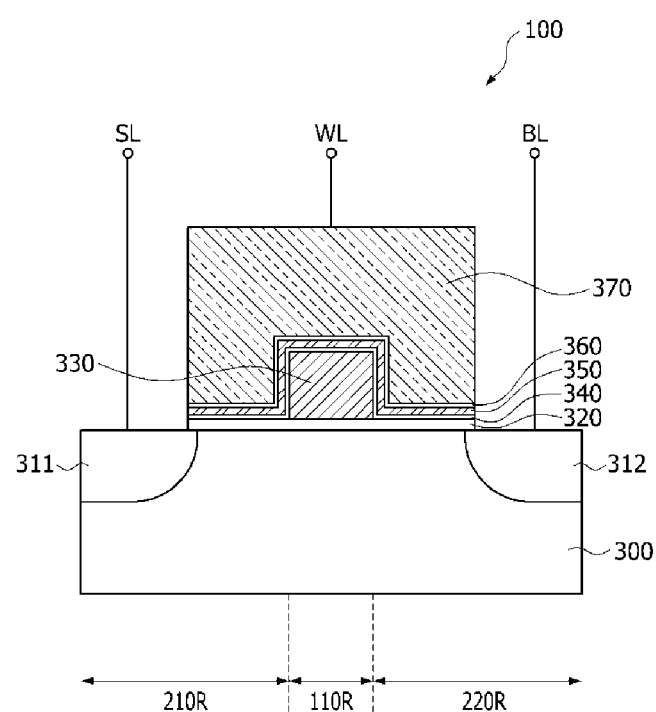
FIG. 3 is a cross sectional view taken along a line III-III' of FIG. 2 to illustrate a structure of a unit cell of a nonvolatile memory device according to some embodiments.

FIG. 3 is a cross sectional view taken along a line III-III' of FIG. 2 to illustrate a physical structure of the unit cell of FIG. 1. Thus, an equivalent circuit of the unit cell shown in FIG. 3 may be identical to the equivalent circuit of FIG. 1.

Referring to FIGS. 1 and 3, the unit cell 100 of the non-volatile memory device according to the embodiments may include a first impurity junction region 311 and a second impurity junction region 312 which are disposed in a substrate 300 to be spaced apart from each other. The substrate 300 may be a semiconductor substrate such as a silicon substrate, but not limited thereto. The substrate 300 may have a first charge trap region 210R, a second charge trap region 220R, and a selection region 110R between the first and second charge trap regions 210R and 220R. The first impurity junction region 311 may be disposed in the first charge trap region 210R, and the second impurity junction region 312 may be disposed in the second charge trap region 220R. In some embodiments, the first impurity junction region 311 may correspond to a source region, and the second impurity junction region 312 may correspond to a drain region. In such a case, the first impurity junction region 311 may be electrically connected to a source line SL, and the second impurity junction region 312 may be electrically connected to a bit line BL. A selection transistor (110 of FIG. 1) may be disposed in the selection region 110R. Further, a first charge trap transistor (210 of FIG. 1) may be disposed in the first charge trap region 210R, and a second charge trap transistor (220 of FIG. 1) may be disposed in the second charge trap region 220R.

A first insulation layer pattern 320 may be disposed on a surface of the substrate 300 between the first and second impurity junction regions 311 and 312. In some embodiments, the first insulation layer pattern 320 may include an oxide layer. While the surface of the substrate 300 in the selection region 110R is entirely covered with the first insulation layer pattern 320, a surface of the substrate 300 in each of the first and second charge trap regions 210R and 220R may be partially covered with the first insulation layer pattern 320. The first insulation layer pattern 320 in the selection region 110R may act as a gate insulation layer. A gate conductive layer pattern 330 of the selection transistor 110 may be disposed on a surface of the first insulation layer pattern 320 opposite to the substrate 300 in the selection region 110R. In some embodiments, the gate conductive layer pattern 330 of the selection transistor 110 may include a polysilicon layer doped with impurity ions. Alternatively, the gate conductive layer pattern 330 of the selection transistor 110 may include a metal layer. A second insulation layer pattern 340 may be disposed on a top surface and sidewalls of the gate conductive layer pattern 330, and the second insulation layer pattern 340 may also extend to cover the first insulation layer pattern 320 disposed in the first and second charge trap regions 210R and 220R. A charge trap layer pattern 350 and a third insulation layer pattern 360 may be sequentially stacked on the second insulation layer pattern 340.

At least one of the second and third insulation layer patterns 340 and 360 may include an oxide layer. The charge trap layer pattern 350 may include a nitride layer. The first and second insulation layer patterns 320 and 340 sequentially stacked in each of the first and second charge trap regions 210R and 220R may act as a tunneling layer. The second insulation layer pattern 340 in the selection region 110R may act as an insulation layer between the gate conductive layer pattern 330 and the charge trap layer pattern 350 of the selection transistor 110. The charge trap layer pattern 350 in the first charge trap region 210R may act as a charge trap layer of the first charge trap transistor 210, and the charge trap layer pattern 350 in the second charge trap region 220R may act as a charge trap layer of the second charge trap transistor 220.

A control gate 370 may be disposed on the third insulation layer pattern 360. In some embodiments, the control gate 370 may include a polysilicon layer doped with impurity ions. Alternatively, the control gate 370 may include a metal layer. The gate conductive layer pattern 330 and the control gate 370 in the selection region 110R may be sequentially stacked such that a coupling voltage is induced at the gate conductive layer pattern 330 when a predetermined voltage is applied to the control gate 370. The coupling voltage induced at the gate conductive layer pattern 330 may be determined by a coupling ratio of a stack structure including the gate conductive layer pattern 330 and the control gate 370, and the coupling ratio may depend on dielectric constants and thicknesses of the first insulation layer pattern 320, the second insulation layer pattern 340, the charge trap layer pattern 350 and the third insulation layer pattern 360. The control gate 370 in the first charge trap region 210R may act as a control gate of the first charge trap transistor 210, and the control gate 370 in the second charge trap region 220R may act as a control gate of the second charge trap transistor 220. The control gate 370 may be electrically connected to a word line WL. Accordingly, if a first voltage is applied to the control gate 370 through the word line WL, a second voltage may be induced at the gate conductive layer pattern 330 capacitively coupled to the control gate 370 and the first voltage may also be applied to the control gates of the first and second charge trap transistors 210 and 220. In some embodiments, the substrate 300 may be a P-type semiconductor substrate, and the first and second impurity junction regions 311 and 312 may be N-type impurity regions.

Referring to FIGS. 1, 3 and 4, to execute a first program operation (program 1) for selectively programming the first charge trap transistor 210 of the unit cell 100, a program voltage +VPP may be applied to the word line WL and a first source line voltage +VSL1 may be applied to the source line SL with the bit line BL grounded. Under the above bias condition, a coupling voltage may be induced at the gate conductive layer pattern 330 in the selection region 110R while the program voltage +VPP is applied to the word line WL. The program voltage +VPP may be higher than the first source line voltage +VSL1. As a result, the selection transistor 110 may be turned on, and channel hot electrons may be generated in the substrate 300 adjacent to the first impurity junction region 311. These channel hot electrons may be injected and trapped in the charge trap layer pattern 350 of the first charge trap region 210R due to an electric field formed by a voltage difference between program voltage +VPP and the first source line voltage +VSL1. Thus, a threshold voltage of the first charge trap transistor 210 may positively increase to program the first charge trap transistor 210. Subsequently, to execute a second program operation (program 2) for selectively programming the second charge trap transistor 220 of the unit cell 100, a program voltage +VPP may be applied to the word line WL and a first bit line voltage +VBL1 may be applied to the bit line BL with the source line SL grounded. Under the above bias condition, a coupling voltage may be induced at the gate conductive layer pattern 330 in the selection region 110R while the program voltage +VPP is applied to the word line WL. The program voltage +VPP may be higher than the first bit line voltage +VBL1. As a result, the selection transistor 110 may be turned on, and channel hot electrons may be generated in the substrate 300 adjacent to the second impurity junction region 312. These channel hot electrons may be injected and trapped in the charge trap layer pattern 350 of the second charge trap region 220R due to an electric field formed by a voltage difference between program voltage +VPP and the first bit line voltage +VBL1. Thus, a threshold voltage of the second charge trap transistor 220 may positively increase to program the second charge trap transistor 220. The substrate 300 may be grounded during the first and second program operations (i.e., the program 1 and the program 2).

In order to execute an erasure operation, a first erasure voltage −VEE1 (e.g., a negative voltage) may be applied to the word line WL and a second erasure voltage +VEE2 (e.g., a positive voltage) may be applied to both the source line SL and the bit line BL. Under the above bias condition, the electrons in the charge trap layer pattern 350 disposed in the first and second charge trap regions 210R and 220R may be removed to lower the threshold voltages of the first and second charge trap transistors 210 and 220. As a result, both the first and second charge trap transistors 210 and 220 may be erased. In some embodiments, only one of the first and second charge trap transistors 210 and 220 may be erased. In order to selectively erase only the first charge trap transistor 210, a negative erasure voltage may be applied to the word line WL and a positive erasure voltage (e.g., the second erasure voltage +VEE2) may be applied to only the source line SL. In such a case, the bit line BL may be floated. Thus, the electrons in the charge trap layer pattern 350 disposed in the first charge trap region 210R may be removed to lower the threshold voltage of the first charge trap transistor 210. In such a case, the electrons in the charge trap layer pattern 350 disposed in the second charge trap region 220R may still remain to maintain the programmed state of the second charge trap transistor 220. Similarly, in order to selectively erase only the second charge trap transistor 220, a negative erasure voltage may be applied to the word line WL and a positive erasure voltage (e.g., the second erasure voltage +VEE2) may be applied to only the bit line BL. In such a case, the source line SL may be floated. The erasure voltage applied to the word line WL when only one of the first and second charge trap transistors 210 and 220 is erased may be higher than the first erasure voltage −VEE1 applied to the word line WL when both the first and second charge trap transistors 210 and 220 are erased. That is, a voltage difference between the word line WL and the source line SL (or the bit line BL) when only one of the first and second charge trap transistors 210 and 220 is erased may be less than a voltage difference between the word line WL and the source/bit lines SL/BL when both the first and second charge trap transistors 210 and 220 are erased. The substrate 300 may be grounded during the erasure operation.

In order to execute a first read operation (read 1) for selectively reading out the data stored in the first charge trap transistor 210, a read voltage VREAD may be applied to the word line WL and a second bit line voltage +VBL2 may be applied to the bit line BL with the source line SL grounded. Under this bias condition, a coupling voltage may be induced at the gate conductive layer pattern 330 in the selection region 110R while the read voltage VREAD is applied to the word line WL. As a result, the selection transistor 110 in the selection region 110R may be turned on. Further, a reverse bias may be applied between the substrate 300 and the second impurity junction region 312 because the second bit line voltage +VBL2 applied to the bit line BL is a positive voltage. Thus, a depletion region may be formed in the substrate 300 adjacent to the second impurity junction region 312 and the depletion region may extend toward the selection region 110R. Accordingly, a current flow between the source line SL and the bit line BL may depend on a threshold voltage of the first charge trap transistor 210. That is, in the event that a threshold voltage of the first charge trap transistor 210 is higher than the read voltage VREAD applied to the word line WL, no current flows between the source line SL and the bit line BL. This means that the first charge trap transistor 210 is programmed. In contrast, in the event that a threshold voltage of the first charge trap transistor 210 is lower than the read voltage VREAD applied to the word line WL, a channel current may flow between the source line SL and the bit line BL. This means that the first charge trap transistor 210 is erased.

In order to execute a second read operation (read 2) for selectively reading out the data stored in the second charge trap transistor 220, the read voltage VREAD may be applied to the word line WL and a second source line voltage +VSL2 may be applied to the source line SL with the bit line BL grounded. Under this bias condition, a coupling voltage may be induced at the gate conductive layer pattern 330 in the selection region 110R while the read voltage VREAD is applied to the word line WL. As a result, the selection transistor 110 in the selection region 110R may be turned on. Further, a reverse bias may be applied between the substrate 300 and the first impurity junction region 311 because the second source line voltage +VSL2 applied to the source line SL is a positive voltage. Thus, a depletion region may be formed in the substrate 300 adjacent to the first impurity junction region 311 and the depletion region may extend toward the selection region 110R. Accordingly, a current flow between the source line SL and the bit line BL may depend on a threshold voltage of the second charge trap transistor 220. That is, in the event that a threshold voltage of the second charge trap transistor 220 is higher than the read voltage VREAD applied to the word line WL, no current flows between the source line SL and the bit line BL. This means that the second charge trap transistor 220 is programmed. In contrast, in the event that a threshold voltage of the second charge trap transistor 220 is lower than the read voltage VREAD applied to the word line WL, a channel current may flow between the source line SL and the bit line BL. This means that the second charge trap transistor 220 is erased. The substrate 300 may be grounded during the read operations (i.e., the read 1 and the read 2).

Figure 5:
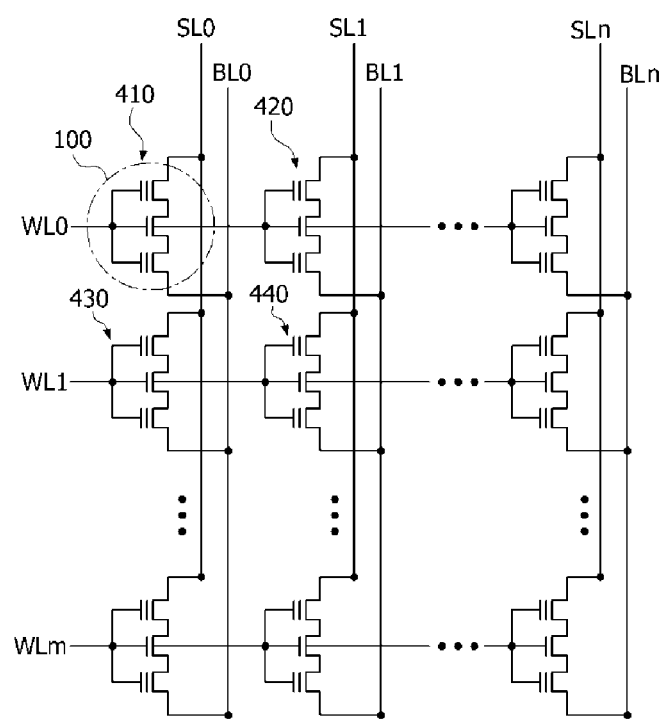
FIG. 5 illustrates an equivalent circuit diagram corresponding to the cell array layout diagram shown in FIG. 2.

Referring to FIG. 5, a plurality of source lines SL0, SL1, . . . , and SLn and a plurality of bit lines BL0, BL1, . . . , and BLn may be arrayed to be parallel with each other. A plurality of unit cells 100 may be connected in parallel between the source lines SL0~SLn and the bit lines BL0~BLn. Each of the unit cells 100 may have the same configuration and structure as described with reference to FIGS. 1 and 3. That is, each of the unit cells 100 may include a first charge trap transistor (210 of FIG. 1), a selection transistor 110 and a second charge trap transistor (220 of FIG. 1) which are connected in series. Thus, each of the unit cells 100 may store two bits of data therein. Further, in a single unit cell, all the gate electrodes of the first charge trap transistor 210, the selection transistor and the second charge trap transistor 220 may be connected to one of a plurality of word lines WL0, WL1, . . . , and WLm. The word lines WL0~WLm may be arrayed to cross the source lines SL0~SLn and the bit lines BL0~BLn. Thus, the plurality of unit cells 100 may be located at respective intersections of the word lines WL0~WLm and the bit lines BL0~BLn (or source lines SL0~SLn). Each of the word lines WL0~WLn may be connected to (n+1)-number of unit cells 100 which are one dimensionally arrayed in a single row. Each of the source lines SL0~SLn (or each of the bit lines BL0~BLn) may be connected to (m+1)-number of unit cells 100 which are one dimensionally arrayed in a single column.

Hereinafter, an operation of the cell array shown in FIG. 5 will be described with reference to FIG. 6. In the following description, a unit cell denoted by a reference numeral "410" corresponds to a selected unit cell, a unit cell denoted by a reference numeral "420" corresponds to a non-selected unit cell that shares a word line with the selected unit cell, a unit cell denoted by a reference numeral "430" corresponds to a non-selected unit cell that shares a source line and a bit line with the selected unit cell, and a unit cell denoted by a reference numeral "440" corresponds to a non-selected unit cell that does not share any word lines/source lines/bit lines with the selected unit cell. Further, the sign "+" in the reference designators representing voltages means a positive voltage, and the sign "−" in the reference designators representing voltages means a negative voltage.

Referring to FIGS. 5 and 6, in order to execute a program operation for selectively programming a unit cell 410, a program voltage +VPP may be selectively applied to a word line WL0 connected to the selected unit cell 410, and remaining word lines WL1~WLm (i.e., non-selected word lines) may be grounded. Further, a source line SL0 connected to the selected unit cell 410 may be grounded, and a first bit line voltage +VBL1 may be applied to a bit line BL0 connected to the selected unit cell 410. In addition, remaining source lines SL1~SLn and remaining bit lines BL1~BLn (i.e., non-selected source lines and non-selected bit lines) may be grounded. Thus, the non-selected unit cells 430 and 440 connected to the non-selected word lines WL1~WLm are not programmed regardless of the voltages applied to the source lines SL0~SLn and the bit lines BL0~BLn because the non-selected word lines WL1~WLm are grounded. Meanwhile, the non-selected unit cell 420 shares the selected word line WL0 having the program voltage +VPP with the selected unit cell 410. Nevertheless, the non-selected unit cell 420 is not programmed because the source line SL1 and the bit line BL1 connected to the non-selected unit cell 420 have the same voltage not to generate any channel hot electrons. As result, a second charge trap transistor (directly connected to the bit line BL0) of the selected unit cell 410 may be selectively programmed by a channel hot electron injection mechanism. However, if the program voltage +VPP is too high, the non-selected unit cell 420 may also be programmed due to a tunneling current flowing through a charge trap layer between the selected word line WL0 and the non-selected source/bit lines SL1 and BL1. Thus, it may be necessary to appropriately control the program voltage +VPP in order to prevent the non-selected unit cell 420 from being undesirably programmed. According to the above embodiment, the second charge trap transistor (directly connected to the bit line BL0) of the selected unit cell 410 may be selectively programmed, as mentioned above. A method of selectively programming a first charge trap transistor (directly connected to the source line SL0) of the selected unit cell 410 may be similar to that of selectively programming the second charge trap transistor of the selected unit cell 410 described above. That is, to selectively program the first charge trap transistor of the selected unit cell 410, the bit line BL0 may be grounded and a source line voltage which is equal to the first bit line voltage +VBL1 may be applied to the source line SL0. The remaining bias conditions may be the same as described above.

In order to execute an erasure operation for selectively erasing the data stored in the unit cell 410, a first erasure voltage −VEE1 may be applied to the word line WL0 connected to the selected unit cell 410 and the remaining word lines WL1~WLm may be grounded. Further, a second erasure voltage +VEE2 may be applied to the source line SL0 and the bit line BL0 connected to the selected unit cell 410, and the remaining source lines SL1~SLn and the remaining bit lines BL1~BLn may be grounded. Thus, the non-selected unit cells 430 and 440 connected to the non-selected word line WL1 are not erased regardless of the voltages applied to the source lines SL0~SLn and the bit lines BL0~BLn because the non-selected word line WL1 is grounded. Meanwhile, the non-selected unit cell 420 shares the selected word line WL0 having the first erasure voltage −VEE1 with the selected unit cell 410. Nevertheless, the non-selected unit cell 420 is not erased because the source line SL1 and the bit line BL1 connected to the non-selected unit cell 420 are grounded. As a result, both the first and second charge trap transistors of the selected unit cell 410 may be selectively erased by a tunneling mechanism. According to the above embodiment, both the first and second charge trap transistors of the selected unit cell 410 may be erased, as mentioned above. In order to selectively erase only one of the first and second charge trap transistors of the selected unit cell 410, one of the source line SL0 and the bit lines BL0 may be floated and the remaining bias conditions may be the same as described above.

In order to execute a read operation for selectively reading out the data stored in the unit cell 410, a read voltage VREAD (e.g., a positive voltage) may be applied to the word line WL0 connected to the selected unit cell 410 and the remaining word lines WL1~WLm may be grounded. Further, the source line SL0 connected to the selected unit cell 410 may be grounded and a second bit line voltage +VBL2 may be applied to the bit line BL0 connected to the selected unit cell 410. In addition, the remaining source lines SL1~SLn and the remaining bit lines BL1~BLn may be grounded. Under this bias condition, the unit cells 430 and 440 connected to the non-selected word line WL1 are not selected regardless of the voltages applied to the source lines SL0~SLn and the bit lines BL0~BLn because the non-selected word line WL1 is grounded to turn off the selection transistors of the unit cells 430 and 440. Meanwhile, the unit cell 420 shares the selected word line WL0 having the read voltage VREAD with the selected unit cell 410. Nevertheless, the unit cell 420 is not selected because the source line SL1 and the bit line BL1 connected to the non-selected unit cell 420 are grounded. As result, a datum stored in the first charge trap transistor (directly connected to the source line SL0) of the selected unit cell 410 may be selectively read out. According to the above embodiment, the first charge trap transistor of the selected unit cell 410 may be selectively read out, as mentioned above. In order to selectively read out the second charge trap transistor of the selected unit cell 410, the bit line BL0 may be grounded and a source line voltage which is equal to the second bit line voltage +VBL2 may be applied to the source line SL0. The remaining bias conditions may be the same as described above.

Figure 7:
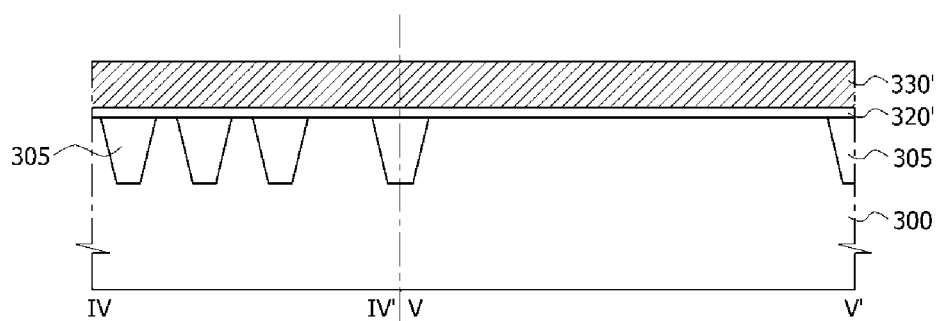
FIGS. 7 to 10 are merged cross sectional views taken along lines IV-IV' and V-V' of FIG. 2 that illustrate methods of fabricating a nonvolatile memory device according to some embodiments.

Now, a method of fabricating a nonvolatile memory device according to some embodiments will be described with reference to FIGS. 7 to 10. In each of FIGS. 7 to 10, a left side drawing is a cross sectional view taken along a line IV-IV' of FIG. 2 and a right side drawing is a cross sectional view taken along a line V-V' of FIG. 2. Referring to FIG. 7, an isolation layer 305 may be formed in a semiconductor substrate 300 such as a silicon substrate to define active regions. The isolation layer 305 may be formed using a trench isolation technique. The active regions defined by the isolation layer 305 may be formed to have a stripe shape which is parallel with the X-axis direction and may be arrayed to be spaced apart from each other by a specific distance in the Y-axis direction, as illustrated in FIG. 2. To form the trench isolation layer 305, an isolation hard mask pattern having an opening may be formed on the substrate 300. The opening of the isolation hard mask pattern may expose a portion of the substrate 300 to define an isolation region. The substrate 300 may then be etched using the isolation hard mask pattern as an etch mask, thereby forming a trench having a predetermined depth. An insulation layer may be formed in the trench to form the isolation layer 305. After the isolation layer 305 is formed, the isolation hard mask pattern may be removed. In some embodiments, a step of removing the isolation hard mask pattern may be omitted after the isolation layer 305 is formed. Although not shown in the drawings, a well region may be formed in a portion of the substrate 300 after formation of the isolation layer 305. Subsequently, a first insulation layer 320' and a gate conductive layer 330' may be sequentially formed on a surface of the substrate 300. The first insulation layer 320' may be formed to include an oxide layer. The gate conductive layer 330' may be formed to include a polysilicon layer which is doped with impurity ions.

Figure 8:
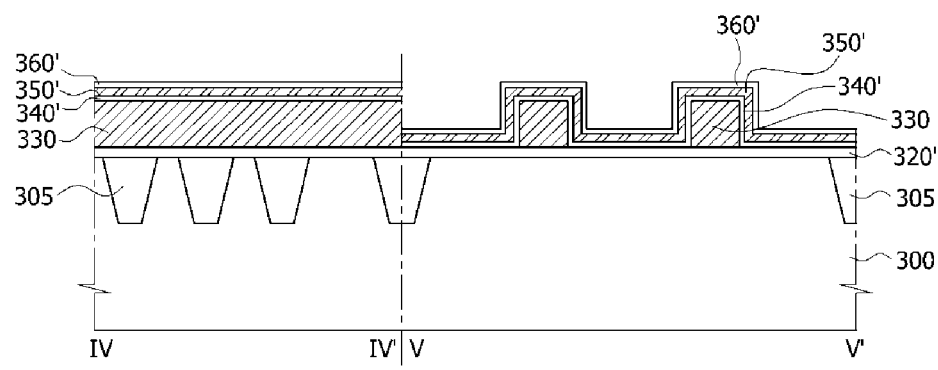

Referring to FIG. 8, the gate conductive layer 330' may be patterned to form gate conductive layer patterns 330. The gate conductive layer patterns 330 may act as gates (330a, 330b and 330c of FIG. 2) of selection transistors (110 of FIG. 1). The gate conductive layer patterns 330 may be formed to have a stripe shape which is parallel with the Y-axis direction and may be arrayed to be spaced apart from each other by a specific distance in the X-axis direction, as illustrated in FIG. 2. A second insulation layer 340', a charge trap layer 350' and a third insulation layer 360' may be sequentially formed on the substrate including the gate conductive layer patterns 330. In some embodiments, the second insulation layer 340', the charge trap layer 350' and the third insulation layer 360' may be formed to have an oxide-nitride-oxide (ONO) structure. That is, the second insulation layer 340' and the third insulation layer 360' may be formed of an oxide layer, and the charge trap layer 350' may be formed of a nitride layer.

Figure 9:
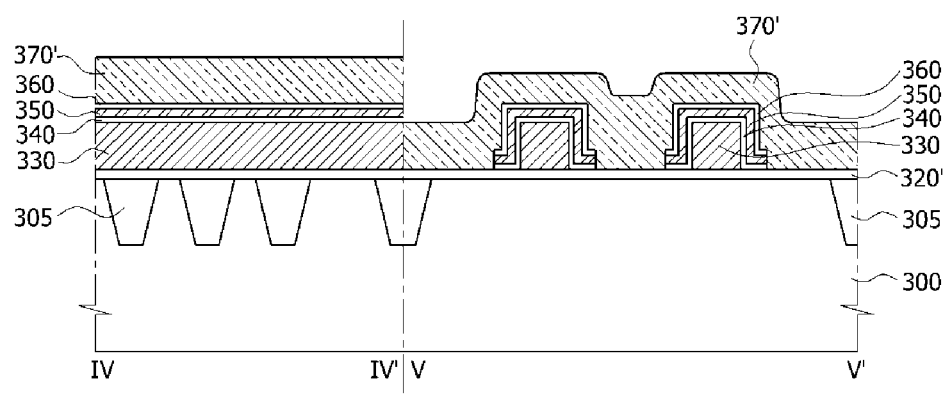

Referring to FIG. 9, the third insulation layer 360', the charge trap layer 350' and the second insulation layer 340' may be patterned to form second insulation layer patterns 340, charge trap layer patterns 350 and third insulation layer patterns 360. As illustrated in the right side of FIG. 9, each of the second insulation layer patterns 340 may be formed to cover sidewalls and a top surface of one of the gate conductive layer patterns 330. Further, the charge trap layer patterns 350 may be formed on respective ones of the second insulation layer patterns 340, and the third insulation layer patterns 360 may be formed on respective ones of the charge trap layer patterns 350. In particular, each of the charge trap layer patterns 350 may laterally extend to cover portions of the first insulation layer 320' adjacent to opposite sidewalls of one of the gate conductive layer patterns 330. A pair of lateral extended portions of each of the charge trap layer patterns 350 may define a first charge trap region and a second charge trap region, respectively. Subsequently, a control gate conductive layer 370' may be formed on the substrate including the second insulation layer patterns 340, the charge trap layer patterns 350 and the third insulation layer patterns 360. In some embodiments, the control gate conductive layer 370' may be formed to include a polysilicon layer doped with impurity ions.

Figure 10:
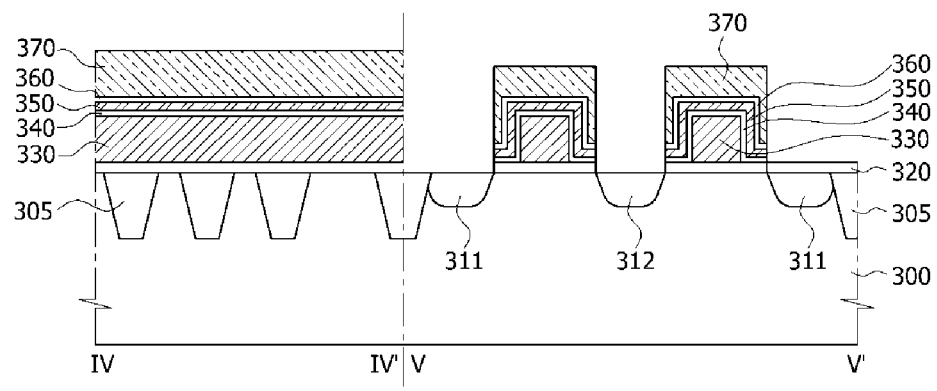

Referring to FIG. 10, the control gate conductive layer 370' may be patterned to form control gates 370 which are disposed on respective ones of the third insulation layer patterns 360. When the control gate conductive layer 370' is patterned using an etch process, a mask pattern such as a photoresist pattern may be used as an etch mask. After the control gates 370 are formed, impurity ions may be implanted into the active regions using the control gates 370 as ion implantation masks to form first and second impurity junction regions 311 and 312. Although not shown in the drawings, each of the first and second impurity junction regions 311 and 312 may be formed to have a lightly doped drain (LDD) structure including a shallow source/drain extension region and a deep source/drain region. Next, an interlayer insulation layer (not shown) may be formed on an entire surface of the substrate including the first and second impurity junction regions 311 and 312. The interlayer insulation layer may be patterned to form contact holes exposing portions of the control gates 370 and portions of the first and second impurity junction regions 311 and 312. Contacts (i.e., contact plugs) may then be formed in respective ones of the contact holes. The contacts may be formed of a conductive layer.

According to the embodiments set forth above, a unit cell of a nonvolatile memory device may be configured to include a pair of memory transistors and a selection transistor which are electrically connected in series. Thus, even though at least one of the pair of memory transistors is over-erased, the selection transistor may prevent an erroneous operation in a read mode. Further, the unit cell may store two bit data therein because the unit cell includes the pair of memory transistors which are separated from each other by the selection transistor. Accordingly, the integration density of the nonvolatile memory device can be improved.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A nonvolatile memory device comprising:
 a substrate having a first charge trap region, a second charge trap region, and a selection region between the first and second charge trap regions;
 a first impurity junction region in a portion of the substrate of the first charge trap region;
 a second impurity junction region in a portion of the substrate of the second charge trap region;
 a first insulation layer pattern on the substrate having the first charge trap region, the second charge trap region and the selection region;
 a gate conductive layer pattern on the first insulation layer pattern in the selection region;
 a second insulation layer pattern covering the gate conductive layer pattern in the selection region and extending onto the first insulation layer pattern in the first and second charge trap regions; and
 a charge trap layer pattern, a third insulation layer pattern and a control gate sequentially stacked on the second insulation layer pattern.

2. The nonvolatile memory device of claim 1, wherein the gate conductive layer pattern is separated from the control gate by the second insulation layer pattern, the charge trap layer pattern and the third insulation layer pattern to have a floated state.

3. The nonvolatile memory device of claim 1, wherein the second insulation layer pattern, the charge trap layer pattern and the third insulation layer pattern are stacked to have an oxide-nitride-oxide (ONO) structure.

4. The nonvolatile memory device of claim 3, wherein the first and second insulation layer patterns are configured to perform as tunneling layers for the first and second charge trap regions.

5. The nonvolatile memory device of claim 1, wherein:
 the first impurity junction region is configured as a source region; and
 the second impurity junction region is configured as a drain region.

6. The nonvolatile memory device of claim 5, further comprising:
 a source line electrically connected to the first impurity junction region;
 a bit line electrically connected to the second impurity junction region; and
 a word line electrically connected to the control gate.

7. The nonvolatile memory device of claim 1, wherein the gate conductive layer pattern includes a polysilicon layer doped with impurity ions or a metal layer.

8. The nonvolatile memory device of claim 1, wherein the control gate includes a polysilicon layer doped with impurity ions or a metal layer.

9. The nonvolatile memory device of claim 1, wherein the control gate located in the first charge trap region is configured to perform as the control gate of a first charge trap transistor and the control gate located in the second charge trap region is configured to perform as the control gate of a second charge trap transistor.

10. The nonvolatile memory device of claim 1, wherein:
 the substrate comprise a P-type semiconductor substrate, and
 the first and second impurity junction regions comprise N-type impurity regions.

\* \* \* \* \*